(12) United States Patent
Maleville et al.

(10) Patent No.: US 7,585,793 B2
(45) Date of Patent: Sep. 8, 2009

(54) METHOD FOR APPLYING A HIGH TEMPERATURE HEAT TREATMENT TO A SEMICONDUCTOR WAFER

(75) Inventors: Christophe Maleville, La Terrasse (FR); Walter Schwarzenbach, Saint Nazaire Les Eymes (FR); Vivien Renauld, Pontcharra (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 223 days.

(21) Appl. No.: 11/529,959

(22) Filed: Sep. 29, 2006

(65) Prior Publication Data

US 2007/0026692 A1 Feb. 1, 2007

Related U.S. Application Data

(63) Continuation of application No. PCT/IB2005/000492, filed on Feb. 3, 2005.

(51) Int. Cl.
*H01L 21/00* (2006.01)
(52) U.S. Cl. .............. 438/799; 438/406; 257/506; 257/E21.561; 257/E27.112
(58) Field of Classification Search .......... 438/799, 438/406, 63, 480; 257/507, 506, E21.561, 257/E21.339, E27.112
See application file for complete search history.

(56) References Cited

U.S. PATENT DOCUMENTS

| | | | | |
|---|---|---|---|---|
| 5,405,802 A | * | 4/1995 | Yamagata et al. | 438/459 |
| 5,849,102 A | | 12/1998 | Okonogi | 134/19 |
| 5,930,643 A | * | 7/1999 | Sadana et al. | 438/407 |
| 5,940,685 A | | 8/1999 | Loomis et al. | 438/60 |
| 6,495,429 B1 | | 12/2002 | Adamcek et al. | 438/407 |
| 6,602,757 B2 | * | 8/2003 | Hovel et al. | 438/407 |
| 6,858,076 B1 | | 2/2005 | Nakajima et al. | 117/13 |
| 2001/0034074 A1 | | 10/2001 | Makikawa et al. | 438/31 |
| 2003/0143863 A1 | * | 7/2003 | Chen et al. | 438/765 |
| 2007/0066033 A1 | * | 3/2007 | Kurita et al. | 438/473 |

FOREIGN PATENT DOCUMENTS

| | | |
|---|---|---|
| EP | 1 148 356 A2 | 10/2001 |
| EP | 1 158 076 A1 | 11/2001 |
| EP | 1 302 792 A2 | 4/2003 |

\* cited by examiner

*Primary Examiner*—Caridad M Everhart
(74) *Attorney, Agent, or Firm*—Winston & Strawn LLP

(57) ABSTRACT

The invention provides methods for applying high temperature treatments to semiconductor wafers that limit surface tearing-off defects and surface particle contamination. In preferred embodiments, the high temperature treatments begin at boat-in temperatures of less than about 550° C. and include a first temperature ramp-up to the HT treatment temperatures at rates of 6° C./min or less. These methods are advantageously applied to semiconductor wafers comprising layers of different thermal properties, and in particular to semiconductor wafers comprising silicon-on-insulator structures.

15 Claims, 3 Drawing Sheets

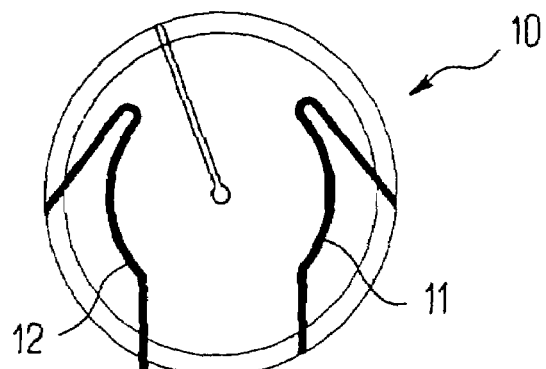
FIG_1
FIG_2
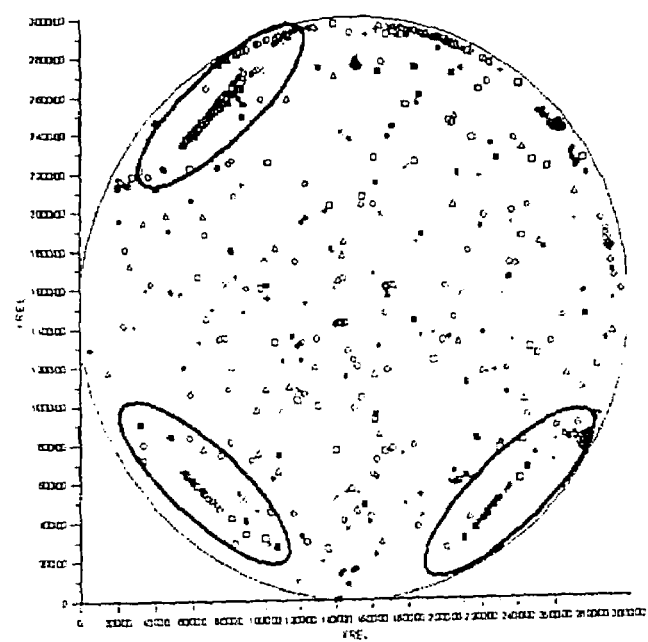
FIG_3

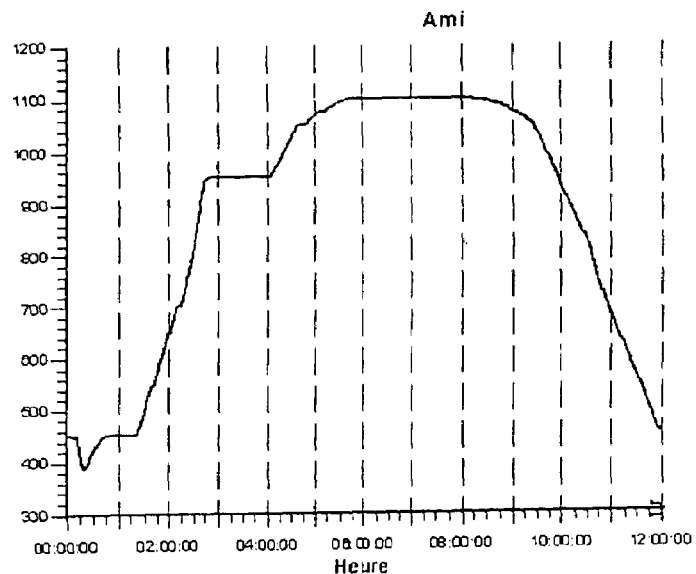
FIG_6
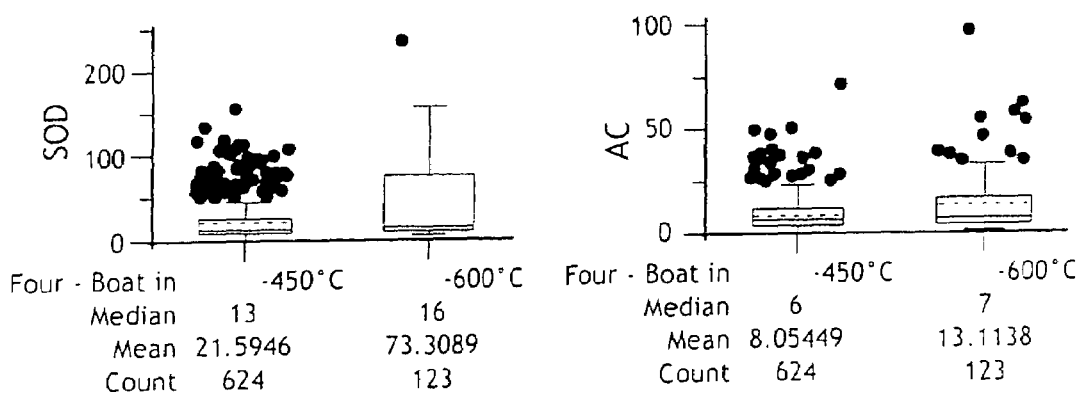
FIG_7a        FIG_7b

METHOD FOR APPLYING A HIGH TEMPERATURE HEAT TREATMENT TO A SEMICONDUCTOR WAFER

CROSS-REFERENCE TO RELATED APPLICATIONS

This application is a continuation of International application PCT/IB2005/000492 filed Feb. 3, 2005, the entire content of which is expressly incorporated herein by reference thereto.

FIELD OF THE INVENTION

The invention generally concerns the high-temperature heat treatment of any kind of semiconductor wafer (wafer made from semiconductor materials). The invention finds advantageous application to the high temperature heat treatment of multilayer wafers having layers which possess differential thermal capacities or properties, and particularly advantageous application to the high-temperature heat treatment of multilayer wafers having a thin surface layer of a thickness between 200 Angströms and 2 microns such as silicon-on-insulator-type (SOI) wafers.

BACKGROUND OF THE INVENTION

High temperature (HT) heat treatment of semiconductor wafers is generally be carried out with significant precautions in order to avoid damaging the wafer's structure (or at least of some of its layers).

Wafers are usually disposed into a receiving structure called a "boat" in order to carry out the heat treatment and specific boats have been developed for minimizing specific type of damage, e.g., slip line generation, during HT heat treatments. FIG. 1 shows an exemplary "low slip line boat" boat 10 made of SiC. This boat comprises fingers 11 and 12 for maintaining each wafer in a horizontal position in the heating chamber during HT heat treatment. For this purpose, the fingers are in contact with the back surface of the wafer.

Although FIG. 1 is a side view showing only one finger 11 and one finger 12, such boats typically comprises several sets of fingers 11 and 12 defining several slots for receiving multiple wafers. Each slot is defined by two adjacent sets of fingers and supports one wafer lying normally in the horizontal plane.

In many types of such boats hold, the fingers hold and support wafers in regions near the wafer center in order to decrease constraints applied to the wafer and thus also decrease the number of the associated slip lines. Other types of boats have fingers which support the wafer only in its edge region. Such configurations tend to create increased mechanical constraints and increased numbers of slip lines.

However, generally low slip line boats, e.g., the boat illustrated in FIG. 1, reduce the number of slip lines generated during HT heat treatments. This reduction is believed to derive from the large surface of contact between the fingers of the boat and the back surface of the wafer.

It has been observed that when SOI wafers are subject to HT heat treatments in such boats, the wafers tend to have defects associated to tearing-off ("tearing-off defects") of at least a portion of one layer. Such tearing-off defects also occur for other type of multilayer wafers. Tearing-off defects correspond to a tearing-off of at least a portion of the surface layer of the wafer and are therefore clearly different from defects in the crystallographic structure of the wafer material (such as slip lines or dislocations). The present invention now provides a solution to this problem.

SUMMARY OF THE INVENTION

This invention provides methods that reduce tearing-off defects of semiconductor wafers during its HT heat treatments. The provided methods also decrease particle contamination of the wafer surface. These improvements are provided by a method for reducing defects when applying a high temperature (HT) heat treatment to a semiconductor wafer. This method comprises providing a heating chamber for conducting a HT heat treatment of a semiconductor wafer, wherein the heating chamber is initially provided at an initial heating temperature; providing a semiconductor wafer at a first temperature for introduction into the heating chamber; and ramping-up the initial temperature of the heating chamber to conduct the HT heat treatment. During the HT heat treatment, either the first temperature of the wafer is provided at a lower temperature compared to that used in a conventional HT heat treatment, or the ramping-up temperature of heating chamber is provided at a slower rate than that used in a conventional HT heat treatment, or both are provided, so that the resulting heat treated wafer exhibits reduced tearing-off defects compared to wafers treated by a conventional HT heat treatment.

The invention more specifically relates to a method for applying a first high temperature (HT) heat treatment to a semiconductor wafer includes a boat-in temperature of less than approximately 550° C. followed by ramping-up the temperature from the boat-in temperature up to the HT heat treatment temperature at a rate of approximately 6° C./min or less.

The boat-in temperature is preferably between approximately 450° C. and approximately 500° C., e.g., approximately 450° C. Also, the HT heat treatment temperature may be approximately 950° C. or more, or is an oxidation temperature, and more particularly an oxidation temperature of a layer of the wafer being treated. In another embodiment, the temperature is maintained at approximately the HT heat treatment temperature for a selected period after which a second temperature ramp-up increases the temperature from the HT heat treatment temperature up to a process temperature, e.g., approximately 1100° C.

The methods of this invention are advantageously applied to multilayer wafers, especially to multilayer wafers having thin surface layers, e.g., surface layers having thickness between approximately 200 Angströms and approximately 2 microns. The methods of this invention are particularly advantageous for processing SOI wafers.

BRIEF DESCRIPTION OF THE DRAWINGS

Other aspects, goals and advantages of the invention shall be apparent in the following description, made in reference to the drawings:

FIG. 1 illustrates an exemplary prior art "low slip line" boat made of SiC;

FIG. 2 illustrates exemplary tearing-off defects observed by SEM;

FIG. 3 illustrates an exemplary map showing the total accumulated defects on several wafers after HT heat treatments in a low slip line boat;

FIG. 6 illustrates the preferred thermal budget according to the invention; and FIGS. 7A and 7B illustrate how reduced boat-in/boat-out temperatures also reduce surface particle contamination of the wafer during the heat treatment.

DETAILED DESCRIPTION OF THE PREFERRED EMBODIMENTS

The term "high temperature" is abbreviated herein as "HT". Also, the terms "HT temperature" or "HT heat treatment temperature" refer to temperatures higher than approximately 800° C. Further, the terms "high temperature heat treatment" or "HT heat treatment" refer to a heat treatment of a semiconductor wafer during which the wafer is exposed to HT temperatures, e.g., to temperatures higher than approximately 800° C.

The term "differential thermal capacity" refers herein to a differential or a difference in the behavior or properties of the different layers of a multilayer wafer upon the exposure to a given heat budget or to a given temperature protocol. Specifically, this term often refers to differences of the thermal expansion coefficients of different layers of the multilayer wafer. These coefficients are generally expressed in $K^{-1}$, typical coefficient values being in the order of a few $10^{-6}\,K^{-1}$, and this use of "differential thermal capacity" indicates a difference of at least $10^{-6}\,K^{-1}$ between thermal expansion coefficients of two layers.

This invention is based on investigations of and discoveries concerning defects arising during the HT heat treatment of semiconductor wafers, particularly, tearing-off defects. These investigations and discoveries are now summarized. FIG. 2 illustrates typical tearing-off defects by SEM. It is believed that such defects result different dilatations of layers of a multilayer the wafer that arise from "differential thermal capacity", particularly from differences in thermal expansion coefficients, of different layers.

Significant tearing-off defects are observed in up to about 40% of silicon-on-insulator (SOI) wafers which have undergone HT heat treatment comprising an oxidation step, during which the wafer is brought from a boat-in temperature to an oxidation temperature of about 950° C., followed by an annealing step, during which the wafer is brought from the oxidation temperature to a temperature of up to 1100° C. Tearing-off defects can be observed using automatic detection tools like the SP1® sold by KLA Tencor.

FIG. 3 shows a typical defect map of defects accumulated on several wafers after HT heat treatments in a low slip line boat as described above. This figure is accumulated from HT heat treatments of several wafers with possibly different angular orientations. The oval lines enclose region of the front surface of the wafers having higher concentrations of tearing-off defects. These regions are opposite to corresponding regions of the back surface of said wafers that are in contact with the large contact surfaces of the fingers of the boat. A fourth area, similar to these enclosed areas, may be present in the upper right part of this figure but it not encircled. More generally, boats that contact a significant area on the wafer surface with (generally the back surface) can generate similar defects.

Figure 4:
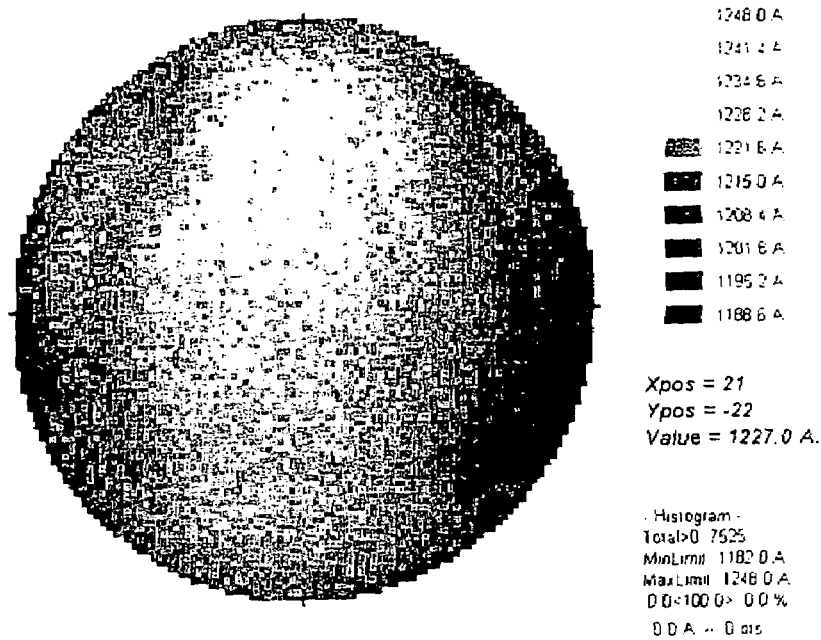
FIG. 4 illustrates non uniform thickness distribution of a surface oxide layer observed on an exemplary wafer having undergone a HT oxidation treatment in a low slip line boat.

It is believed that such defects are generated where the boat and wafer contact because significant temperature gradients can occur in those regions during the HT heat treatment. In fact, the non uniform thickness of a surface oxide layer on a wafer that has undergone HT heat treatment in a low slip line has been observed. FIG. 4 illustrates such a non uniform oxide layer thickness. This non-uniform distribution of oxide thickness reveals a non-uniform distribution of temperature over the surface of the wafer.

Figure 5:
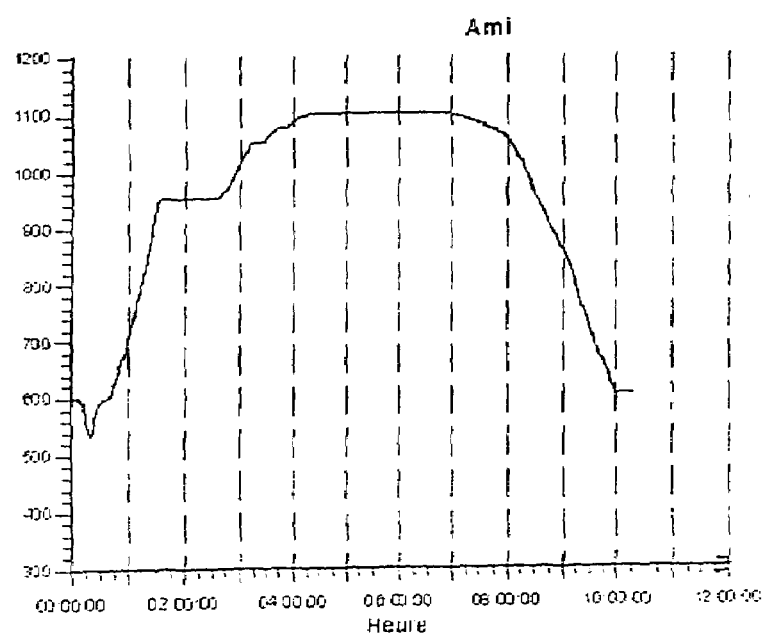
FIG. 5 illustrates a prior art thermal budget used for HT heat treatment.

The observations and drawbacks above have been measured on wafers which have undergone a known or conventional two-step HT heat treatment (i.e., a HT oxidation step, followed by a HT annealing step). FIG. 5 illustrates heating temperatures of such HT heat treatments as a function of time.

FIG. 5 begins at a boat-in temperature of about 600° C. The boat-in temperature corresponds to the temperature at which the boat and its wafer(s) are put into a heating chamber. Known HT heat treatments generally have boat-in temperatures of 600° C. or above. Also, the temperature at which the boat and its wafer(s) are removed from the heating chamber, the boat-out temperature, is generally about the same as the boat-in temperature. After a "cold" element is brought into the heating chamber, there is a transient period of temperature stabilization at the boat-in temperature during which the temperature of this element gradually reaches boat-in temperature throughout.

Next, FIG. 5 illustrates a first ramp-up during which the temperature increase up to a HT heat treatment temperature, e.g. an oxidation temperature of about 950° C. The first ramp-up from the boat-in temperature to the HT heat treatment temperature is usually about 10° C./min or greater. Following the first ramp-up, a constant temperature period provides for formation of the surface oxide layer on the wafer (or other HT heat treatment process). Next, during a second ramp-up, the temperature is increased from the HT heat treatment temperature up to a higher process temperature, e.g., about 1100° C. The two ramps of this HT heat treatment thus bring the temperature from the boat-in temperature up to a process temperature.

In view of the inventors' investigations and discoveries, preferred embodiments of this invention are now described. FIG. 6 represents the heating temperature and time curve for HT heat treatments according to preferred embodiments of the invention. Similar to the known HT heat treatments, the preferred HT heat treatment of FIG. 6 includes the following steps: during a first ramp-up the temperature increases from the boat-in temperature to the HT temperature, e.g., an oxidation temperature of about 950° C.; next the temperature is constant at the HT heat treatment temperature; next, during a second ramp-up the temperature increases from first HT heat treatment temperature to a higher second heat treatment temperature, e.g., a process temperature of about 1100° C. This HT heat treatment can also include additional steps prior or subsequent to these steps as conventionally used in the art.

The primary and significant difference of the HT heat treatment according to the invention, e.g., the HT heat treatment illustrated in FIG. 6, is now described. This HT heat treatment is significantly and specifically different from known two-step HT heat treatments, e.g. the HT heat treatment illustrated in FIG. 5. First, in the HT heat treatment of the invention, the boat-in temperature is significantly lower than the boat-in temperatures of known HT heat treatments. Preferred boat-in temperatures are about 550° C. or less. In contrast, boat-in temperatures of known HT heat treatments are about 600° C. or above. More preferably, the boat-in temperature can be between about 450° C. and about 550° C., and even more preferably the boat-in temperature can be about 450° C. or less. It has been experimentally observed that a boat-in temperature of about 450° C. is particularly advantageous.

Second, in the HT heat treatment of the invention, the rate of the first temperature ramp-up from a preferred boat-in temperature to a first HT heat treatment temperature is significantly lower than corresponding ramp-up rates of known HT heat treatments. Preferred first ramp-up rates are about 6° C./min or less. In contrast, ramp-up rates of known HT heat treatments are usually about 10° C./min or greater.

Each of these two features of this invention, e.g., the reduction of boat-in temperature and the reduction of the rate of temperature ramp-up, and even more so their combination, provide surprising benefits compared to known HT heat treatments in the reduction and near elimination of tear-off defects. One of ordinary skill in the art generally seeks to increase throughput of semiconductor process and therefore seeks shorter HT heat treatments. Shorter HT heat treatments generally require either higher boat-in temperatures and/or higher rates of temperature ramp-up. Therefore, one of ordinary skill in the art would not seek to decrease both these parameters absent additional teaching or suggestion.

In alternative preferred embodiments, the methods of the invention include only one but not both of the above features, namely, either a reduced boat-in temperature or a reduced rate of the first temperature ramp-up. However, methods including both features are particularly preferred. It has been experimentally observed that the HT heat treatments of the invention provide significant decreases of the proportion of wafers with tear-off defects, e.g., from a proportion of about 40% down to a proportion of nearly 0%.

In alternative preferred embodiments, the HT heat treatments of this invention can comprise temperatures higher than the 800° C. as mentioned above. For example, the particular case illustrated below corresponds to an advantageous embodiment where the HT heat treatment comprises temperatures in the range of 950° C. In fact, for even higher temperatures (typically above 950° C.), the invention is even more advantageous. Further, boat-in temperatures of about 450° C. or less are particularly advantageous in this embodiment as well. The invention can be applied for any HT heat treatment (above 800° C.), and more particularly those conducted above 950° C.

In alternative preferred embodiments, the two features of this invention mentioned above can be advantageously implemented in HT treatments for virtually any type of semiconductor wafer. The values given above for the temperatures and/or durations of the HT heat treatment according to the invention can be adapted, among others as a function of the material(s) of the wafer to be treated.

More preferred alternative implementations are directed to semiconductor wafers having thin surface layers, i.e., multilayer wafers. The invention is particularly advantageous for multilayer wafers in which different layers have differential of thermal capacities or behaviors. Layers with differential of thermal capacities or behaviors generally include differences of more than $10^{-6}$ $K^{-1}$ between the respective thermal expansion coefficients of the respective layers. For such wafers, thermal induced stress is increased by the differential of thermal capacities, e.g., in particular the differential thermal expansion, of the different layers of the wafer. Such multilayer wafers include silicon-on-insulator (SOI) type wafers comprising a thin surface layer and a buried oxide layer. But the invention is not limited to SOI wafers which only represent a preferred application of the invention.

Further surprising advantages have been found for the use of the lower boat-in temperatures. There advantages are seen in FIGS. 7A and 7B, both of which illustrate counts of particle contaminations on two groups of similar SOI wafers observed after HT heat treatments. The HT heat treatments of both groups were as illustrated in FIG. 6, except that a first batch of 624 wafers was exposed to a boat-in temperature of 450° C. while a second batch of 123 wafers was exposed to a boat-in temperature of 600° C. The respective boat-in temperatures are indicated on the horizontal axis in FIGS. 7A and 7B.

FIG. 7A indicates counts of all observed particle contamination defects (the "Sum of Defects" or SOD), while FIG. 7B indicates counts of only those particle contamination defects having a size larger than a threshold value (the "Area Count" or AC). Comparing these figures, it is apparent that lowering the boat-in temperature by 150° C. significantly decreased observed surface particle contamination. Specifically, the SOD illustrated in FIG. 7A decreased from a median count of 73.3 at a boat-in temperature of 600° C. down to a median count of 21.59 at a boat-in temperature of 450° C. For FIG. 7b, the defects illustrated decreased from a median count of 13.11 at a boat-in temperature of 600° C. down to a median count of 8.05 at a boat-in temperature of 450° C.

It is believed that this decrease in particle contaminants can be explained as follows. During the transition phases of boat-in (introduction of the cool wafer into the hotter annealing chamber) and boat-out (introduction of the hot wafer into the cooler environment), differences between the thermal expansion coefficients of the boat fingers and of the back surface of the wafer which contacts the fingers can induce mechanical stress in the wafer. The stress can also lead to possible movement of the wafer with respect to the boat fingers. Thereby, particle contamination is generated from the material of the wafer.

Although such particle contamination is initially generated at the back surface of each wafer, because the wafers are usually treated by batches where the wafers are oriented horizontally and stacked along the vertical direction in the HT treatment chamber, contaminants generated at each back surface of a given wafer fall onto the front surface of the wafer located under said given wafer. Thereby, particle contaminants originated on the back surfaces of the wafers of a batch can be observed and characterized on the front faces of the wafers.

As already pointed out, the invention has addressed the problem of tearing-off defects in manners counter-intuitive to what would be expected by one of ordinary skill in the art. It is contrary to the general tendency in the art to shorten as much as possible these thermal treatments, and further, it is additionally counter-intuitive to address a problem on the front face of the wafers (tearing-off defects) through an analysis of the causes on the opposite back face of the wafer (temperature distribution).

The preferred embodiments of the invention described above do not limit the scope of the invention. Equivalent embodiments are within the scope of the invention. Further, various modifications of the invention in addition to those shown and described herein, such as alternate useful combinations of the elements described, will become apparent to those skilled in the art from the description herein and are also intended to fall within the scope of the appended claims. In the following (and in the application as a whole), headings and legends are used for clarity and convenience only.

What is claimed is:

1. A method for reducing tearing-off defects when applying a high temperature (HT) heat treatment to a semiconductor wafer that comprises a silicon-on-insulator (SOI) structure, which method comprises:
providing a heating chamber for conducting a HT heat treatment of the SOI semiconductor wafer, wherein the heating chamber is initially provided at an initial heating temperature;
providing the SOI semiconductor wafer at a first temperature for introduction into the heating chamber; and ramping-up the initial temperature of the heating chamber to conduct the HT heat treatment;

wherein during the HT heat treatment, either the first temperature of the SOI semiconductor wafer is provided at a lower temperature below 600° C., or the ramping-up temperature of the heating chamber is provided at a rate slower than 10° C./min, or both are provided, so that the resulting heat treated wafer exhibits reduced tearing-off defects compared to silicon-on-insulator wafers treated by a conventional HT heat treatment.

2. The method of claim 1, wherein the SOI semiconductor wafer is introduced into the heating chamber at an initial temperature of about 550° C. or less.

3. The method of claim 1, wherein the ramping-up temperature is conducted at a rate of about 6° C./min or less.

4. The method of claim 1, wherein the initial temperature is between about 450° C. and about 500° C.

5. The method of claim 1, wherein the HT heat treatment temperature is greater than about 950° C.

6. The method of claim 1, wherein the SOI semiconductor wafer comprises a support and a surface layer having a thickness between 200 Angströms and 2 microns.

7. The method of claim 1, wherein the first temperature of the SOI semiconductor wafer is below 600° C. and the ramping-up temperature of the heating chamber is slower than 10° C./min.

8. The method of claim 1, wherein the SOI semiconductor wafer is held in and makes significant contact with a low slip line boat when introduced into the heating chamber.

9. The method of claim 1, which further comprises a stabilization period during which the heating chamber remains at the initial temperature so that the temperature of the introduced SOI semiconductor wafer stabilizes at that temperature.

10. The method of claim 9, wherein the initial temperature is between about 450° C. and about 500° C.

11. The method of claim 1, further comprising:
maintaining the heating chamber at the HT heat treatment temperature; and
further ramping-up the temperature of the heating chamber to a second temperature greater than the HT heat treatment temperature.

12. The method of claim 11, wherein the HT heat temperature reaches an oxidation temperature.

13. The method of claim 12, wherein the oxidation temperature is about 950° C.

14. The method of claim 12, wherein the second high temperature is a process temperature of about 1100° C.

15. A method for reducing tearing-off defects when applying a high temperature (HT) heat treatment to a semiconductor wafer supported by a boat with the wafer comprising a silicon-on-insulator (SOI) structure, which method comprises:

providing a heating chamber for conducting a HT heat treatment of the SOI semiconductor wafer, wherein the heating chamber is initially provided at an initial heating temperature;

providing the SOI semiconductor wafer at a first temperature for introduction into the heating chamber, wherein the SOI semiconductor wafer is held in and makes significant contact with the boat when introduced into the heating chamber; and ramping-up the initial temperature of the heating chamber to conduct the HT heat treatment;

wherein during the HT heat treatment, either the first temperature of the SOI semiconductor wafer is provided at a temperature below 600° C., or the ramping-up temperature of the heating chamber is provided at a rate slower than 10° C./min, or both are provided, so that the resulting heat treated wafer when removed from the slip line boat exhibits reduced tearing-off defects compared to silicon-on-insulator wafers treated by a conventional HT heat treatment.

* * * * *

UNITED STATES PATENT AND TRADEMARK OFFICE
CERTIFICATE OF CORRECTION

| | | |
|---|---|---|
| PATENT NO. | : 7,585,793 B2 | Page 1 of 1 |
| APPLICATION NO. | : 11/529959 | |
| DATED | : September 8, 2009 | |
| INVENTOR(S) | : Maleville et al. | |

It is certified that error appears in the above-identified patent and that said Letters Patent is hereby corrected as shown below:

Title Page:
Item (56) References Cited, before "* cited by examiner," insert:
-- OTHER PUBLICATIONS
Cher Ming Tan et al., "Temperature and Stress Distribution in the SOI Structure During Fabrication," IEEE Transactions on Semiconductor Manufacturing, Vol. 16, No. 2, pp. 314-318 (2003) --

Column 7:
Line 5, before "temperature" delete "lower"

Signed and Sealed this

Twenty-seventh Day of October, 2009

David J. Kappos
*Director of the United States Patent and Trademark Office*